United States Patent
Yasukouchi

(10) Patent No.: US 11,909,364 B2
(45) Date of Patent: Feb. 20, 2024

(54) FAST START UP CONTROL CIRCUIT

(71) Applicant: Cypress Semiconductor Corporation, San Jose, CA (US)

(72) Inventor: Katsuyuki Yasukouchi, Nagoya (JP)

(73) Assignee: Cypress Semiconductor Corporation, San Jose, CA (US)

( * ) Notice: Subject to any disclaimer, the term of this patent is extended or adjusted under 35 U.S.C. 154(b) by 448 days.

(21) Appl. No.: 17/330,130

(22) Filed: May 25, 2021

(65) Prior Publication Data

US 2022/0385250 A1 Dec. 1, 2022

(51) Int. Cl.
*H03F 3/393* (2006.01)
*H03F 3/45* (2006.01)
*G05F 1/46* (2006.01)

(52) U.S. Cl.
CPC ............ *H03F 3/393* (2013.01); *G05F 1/461* (2013.01); *G05F 1/468* (2013.01); *H03F 2200/168* (2013.01)

(58) Field of Classification Search
CPC .... H03F 3/393; H03F 2200/168; G05F 1/461; G05F 1/468

USPC .................................. 330/10, 252–261, 302
See application file for complete search history.

(56) References Cited

U.S. PATENT DOCUMENTS 7,292,095 B2 * 11/2007 Burt .......................... H03F 1/26
  330/69
10,411,664 B2 * 9/2019 Stanescu ................. H03F 3/387

* cited by examiner

*Primary Examiner* — Hieu P Nguyen

(57) ABSTRACT

Embodiments of the present disclosure provide a chopper amplifier circuit that includes an operational amplifier, and a notch filter to be operated by a chopping pulse. The notch filter has a first branch that has a first capacitor, and a second branch that has a second capacitor. A chopping delay switch is connected to the first branch and the second branch of the notch filter. A control circuit is to close the chopping delay switch to short-circuit the first branch and the second branch of the notch filter to each other. The control circuit is to detect establishment of feedback signal at the chopper amplifier. The control circuit is to open the chopping delay switch, responsive to detecting establishment of the feedback signal at the chopper amplifier.

20 Claims, 14 Drawing Sheets

FAST START UP CONTROL CIRCUIT

TECHNICAL FIELD

The present disclosure relates generally to operational amplifiers, and more particularly, to start up control circuits implemented using chopper amplifiers. The present disclosure further relates to voltage reference circuits, and more particularly to buffered voltage reference circuits.

BACKGROUND

There are many types of amplifiers, and for each type of amplifier, many amplifier circuits. Depending on amplifier gain, amplifiers can be used to increase amplitude of a signal (gain greater than one), decrease amplitude (gain less than one), buffer a signal at same size (unity gain, or gain equal one), or convert a signal from one type to another, considering signals expressed as a voltage or a current. One amplifier usage is in buffering a reference voltage, for distribution to other circuits. One type of amplifier that may be used in high precision voltage reference buffering and various further amplifier usage is the chopper amplifier, which has various forms. It is in the above context that present embodiments arise, to address a need for improvement in precision and stability of amplifiers, in general and specifically in voltage reference circuits.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
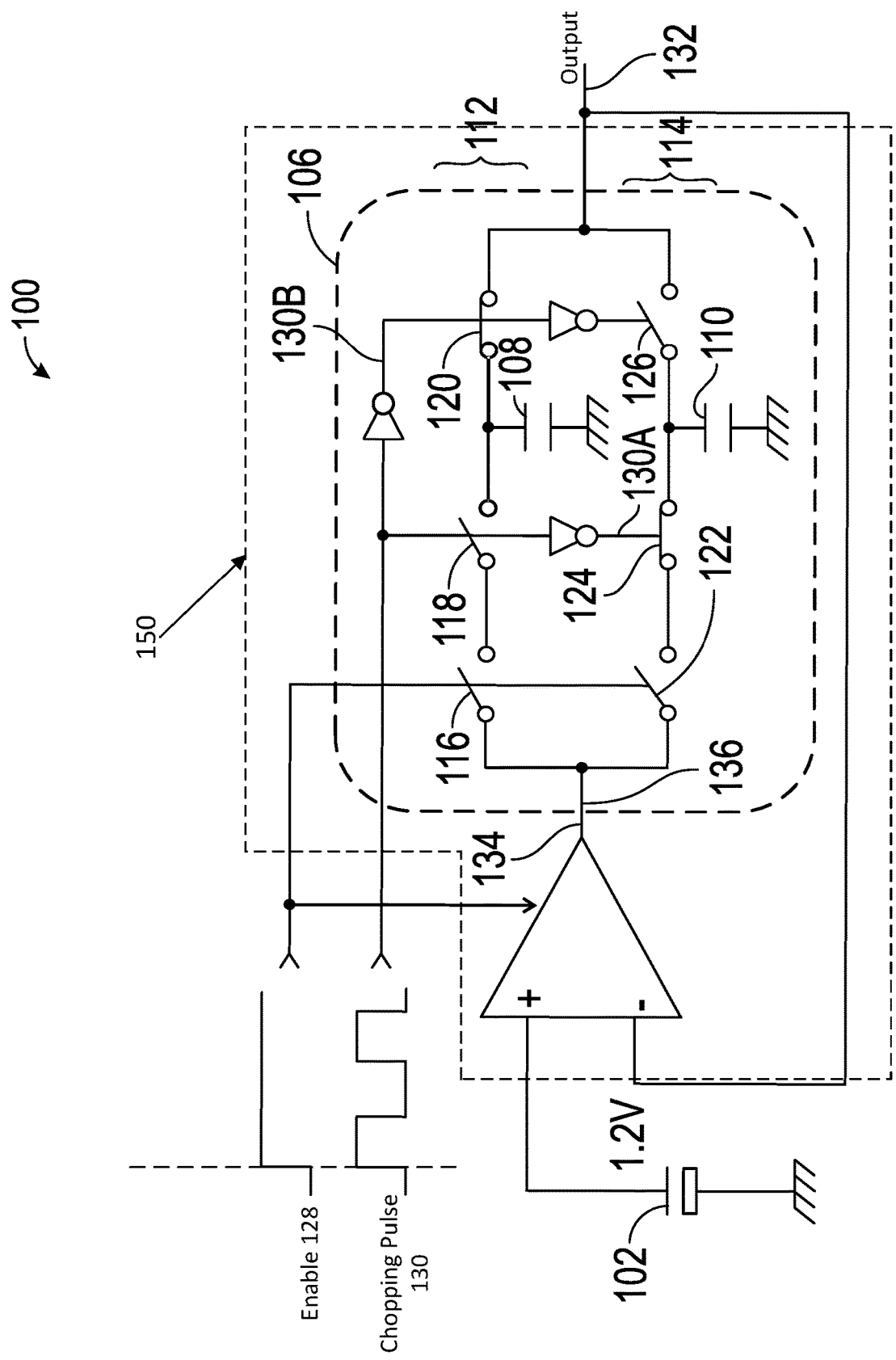
FIG. 1 illustrates a voltage reference circuit that has a bandgap voltage reference connected to a chopper amplifier, in accordance with some embodiments of the present disclosure.

In the following description, for purposes of explanation, numerous specific details are set forth in order to provide a thorough understanding of the present embodiments. It will be evident, however, to one skilled in the art that the present embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment. The phrase "in one embodiment" located in various places in this description does not necessarily refer to the same embodiment.

Components and transistor circuitry depicted and described herein can be implemented in different variations with various technologies and with various transistor types, including CMOS (complementary metal oxide semiconductor) FETs (field-effect transistors), NMOS (N type metal oxide semiconductor), PMOS (P type metal oxide semiconductor), bipolar, BiMOS (bipolar combined with metal oxide semiconductor), BiCMOS (bipolar combined with complementary metal oxide semiconductor), other types of FETs, etc.

A chopper amplifier and a notch filter may be combined to form e.g., a voltage reference circuit. If the bandwidth of the chopper amplifier is close to the chopping frequency, the amount of time required before the output is stable may be significant. This is because the start-up time required by the chopping process is long, and thus the chopping process increases the feedback time of the chopper amplifier. This may also result in output signal overshoot/undershoot. The combination of the output signal overshoot/undershoot and the increased feedback time from the chopping process may result in the amount of time required to obtain a stable output increasing significantly.

Presented herein are various embodiments for an improved chopper amplifier that has an operational amplifier and chopping pulse-operated notch filter. Some embodiments feature a voltage reference generator as input to the chopper amplifier, forming a high precision voltage reference circuit. And, more specifically, some embodiments have a bandgap circuit as a voltage reference generator, and take the form of a high precision bandgap reference (HPBGR). FIGS. 3-11 present embodiments of a combined chopper amplifier and notch filter circuit, with improvements over, and contrasted to, the combined chopper amplifier and notch filter presented with reference to FIGS. 1 and 2. The circuits in accordance with embodiments of the present disclosure show decreased overshoot and undershoot, and decreased time to output stabilization, in comparison to circuits in accordance with previous designs.

Various embodiments of amplifiers, chopper amplifiers, notch filters, control circuits, chopping delay switches, voltage reference circuits, high precision voltage reference circuits, and high precision bandgap references are described herein.

One embodiment is an amplifier apparatus. The amplifier apparatus includes a chopper amplifier that has an operational amplifier with a notch filter. The notch filter is to be operated by a chopping pulse. The notch filter is configured to receive as an input, an output of the operational amplifier. The notch filter is configured to produce a chopper amplifier output that is provided as a feedback signal to an inverting input of the operational amplifier. A chopping delay switch is connected to a first branch of the notch filter, which has a first capacitor, and is connected to a second branch of the notch filter, which has a second capacitor. The amplifier apparatus includes a control circuit. The control circuit is to close the chopping delay switch to short-circuit the first branch and the second branch of the notch filter to each other. The control circuit is to detect establishment of the feedback signal at the chopper amplifier and to open the chopping delay switch, in response to detecting the establishment of the feedback signal at the chopper amplifier.

Another embodiment is a chopper amplifier circuit. The chopper amplifier circuit includes an operational amplifier circuit, a notch filter circuit, a chopping delay switch and a control circuit. The notch filter circuit is to be operated by a chopping pulse. The notch filter circuit has an input connected to the output of the operational amplifier circuit. The notch filter circuit has a first branch that has switches and a first capacitor, and a second branch that has more switches and a second capacitor. The notch filter circuit has an output connected as a feedback signal to the inverting input of the operational amplifier circuit. The chopping delay switch is connected to selectively short-circuit a portion of the first branch of the notch filter circuit and a portion of the second branch of the notch filter circuit to each other. The control circuit is connected to the operational amplifier circuit and connected to operate the chopping delay switch. The control circuit is to detect establishment of the feedback signal at the operational amplifier circuit. The control circuit is to close the chopping delay switch to short-circuit the portion of the first branch of the notch filter and the portion of the second branch of the notch filter, prior to detecting the establishment of the feedback signal at the operational amplifier circuit. The control circuit is to open the chopping delay switch, responsive to the detecting the establishment of the feedback signal at the operational amplifier circuit.

One embodiment as a method of operation of a chopper amplifier circuit. The method includes receiving a noninverting input to the chopper amplifier circuit. The chopper amplifier circuit includes an operational amplifier and a notch filter that is in series connection with the operational amplifier. An output of the notch filter is connected as a feedback signal to an inverting input of the operational amplifier. A chopping delay switch is in a closed state to short-circuit a first branch of the notch filter that has a first capacitor, and a second branch of the notch filter that has a second capacitor, to each other. The method includes determining establishment of the feedback signal at the operational amplifier, according to a control circuit connected to the operational amplifier. The method includes generating a delay to opening the chopping delay switch, based on determining the establishment of the feedback signal at the operational amplifier. And, the method includes changing the chopping delay switch to an open state, based on the determining the establishment of the feedback signal at the operational amplifier and the delay.

Other aspects and advantages of the embodiments will become apparent from the following detailed description taken in conjunction with the accompanying drawings which illustrate, by way of example, the principles of the described embodiments.

FIG. 1 illustrates a voltage reference circuit 100 (hereinafter referred to as reference circuit 100) implemented without embodiments of the present disclosure. The reference circuit 100 comprises a bandgap voltage reference 102 connected to a chopper amplifier 150, which includes an operational amplifier 104 and a chopping pulse-operated notch filter 106 coupled in series, with feedback to the operational amplifier 104. Stated differently, the chopper amplifier 150 comprises the operational amplifier 104 connected in series to the chopping pulse-operated notch filter 106. The reference circuit 100 includes the bandgap voltage reference 102 connected in series to a circuit that has the chopper amplifier 150 in feedback connection.

The bandgap voltage reference 102, or in other embodiments another appropriate voltage reference generator, may provide a voltage reference signal (Vref) and is connected to the noninverting input of the operational amplifier 104, for buffering by the remaining circuitry of the chopper amplifier 150 in a unity gain configuration. The output 132 of the notch filter 106 (which also corresponds to the output of the chopper amplifier 150) is fed back to the inverting input of the operational amplifier 104, which arranges the entire feedback connected chopper amplifier 150 circuit as a voltage follower for the bandgap voltage reference 102 (or other input to the noninverting input of the operational amplifier 104, in other embodiments and further usages of this circuit).

The output 134 of the operational amplifier 104 may connected to the input of (i.e., may also be referred to as input 134 to) the notch filter 106, which has an enable stage comprising switches 116 and 122 and which is controlled by the enable input 128. It should be noted that these and further switches in various embodiments can be implemented with various types of transistors. The notch filter 106 may have two circuit branches, a first branch 112 with multiple switches 116, 118, 120 and a first capacitor 108, and a second branch 114 with multiple switches 122, 124, 126 and a second capacitor 110. Switches after the enable stage in the notch filter 106 are operated by the chopping pulse 130 to "chop up" the input 134 to the notch filter 106 (i.e., the output of the operational amplifier 104) and express the chopped up version of the input 134 as voltage and charge alternately onto the first capacitor 108 and the second capacitor 110, and recombine the voltage and the charge from the first capacitor 108 and the second capacitor 110 in a chopped manner to produce the output 132 of the reference circuit 100 (which also corresponds to the feedback provided to the inverting input of the operational amplifier 104).

More specifically, in the notch filter 106, the input 134 to the notch filter 106, is connected to a first switch 116 of the first branch 112 and a first switch 122 of the second branch 114. The first switch 116, 122 of each of the first and second branches 112, 114 is controlled by the enable input 128. The first switch 116 of the first branch 112 is connected to a second switch 118 of the first branch 112 that is controlled by the chopping pulse 130 and connected to the first capacitor 108. The first switch 122 of the second branch 114 is connected to a second switch 124 of the second branch 114, the second switch 124 of the second branch 114 being controlled by chopping pulse 130A (generated by inverter 127) which is an inverse of the chopping pulse 130. The second switch 124 of the second branch 114 may be connected to the second capacitor 110. The second switch 118 of the first branch 112, and the first capacitor 108, are connected to a third switch 120 of the first branch 112, the third switch 118 being controlled by chopping pulse 130B (generated by inverter 129) which is an inverse of the chopping pulse 130. The second switch 124 of the second branch 114, and the second capacitor 110, are connected to a third switch 126 of the second branch 114 that is controlled by chopping pulse 130C, which is an inverse of chopping pulse 130B. The third switch 120 of the first branch 112 and the third switch 126 of the second branch 114 are connected to each other and to the output 132 of the notch filter 106.

The output 132 of the reference circuit 100 may suffer from overshoot because the chopping process increases the feedback time of the chopper amplifier 150 (the start-up of the chopping process is slow). With the combination of the output 132 signal overshoot and the increased feedback time from the chopping process, the amount of time required to obtain a stable output increases significantly. As discussed in further detail herein, embodiments of the present disclosure provide a chopping circuit that may delay the start of the chopping process to prevent overshoot in the output signal. This may be accomplished by establishing feedback control of the chopper amplifier 150. In one embodiment, the chopping circuit may be tuned so as not to perform chopping until a specific voltage within the circuit is in a target range, thus detecting a specified state in the circuit.

Figure 2:
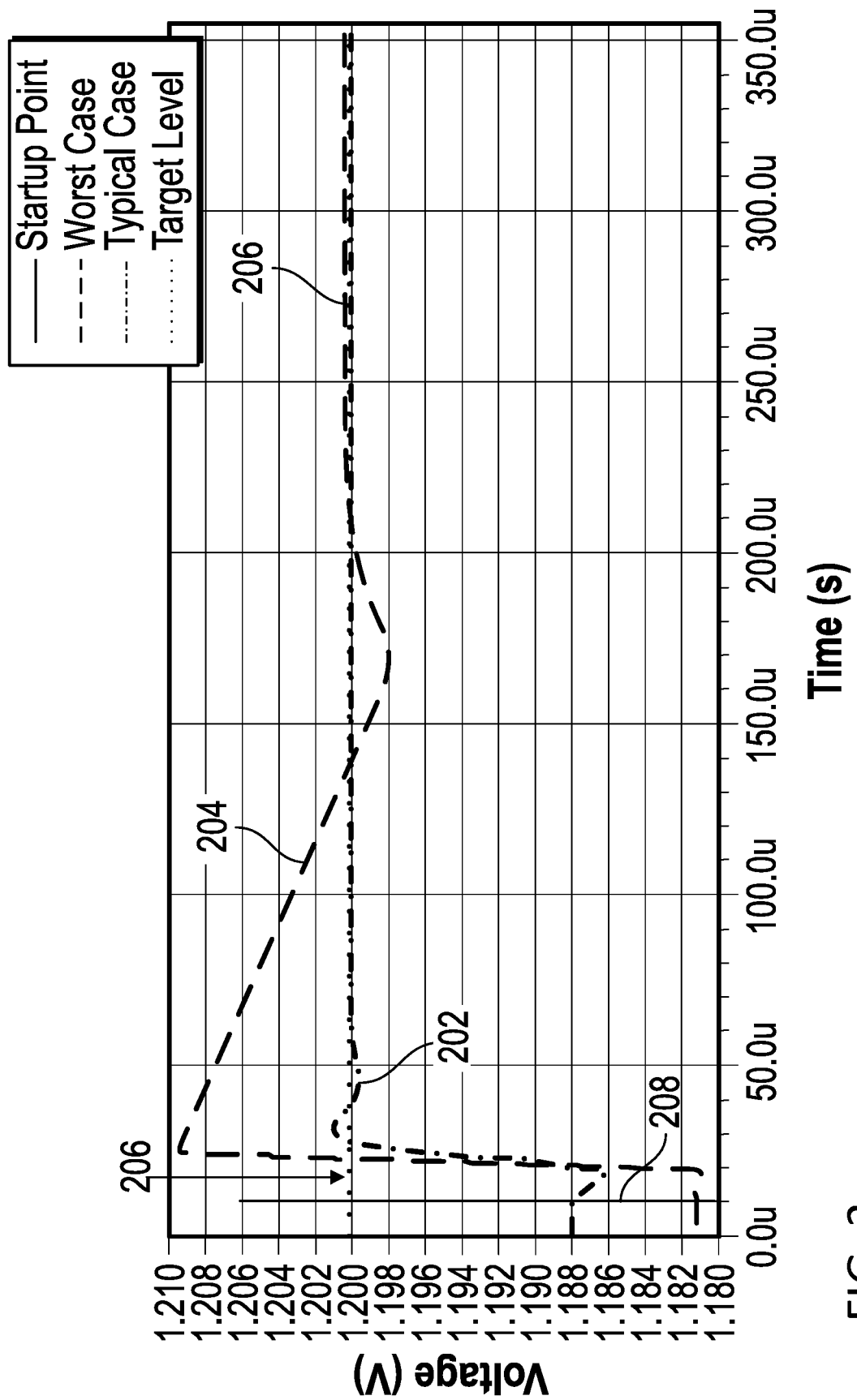
FIG. 2 illustrates typical-case and worst-case scenarios for the output of the voltage reference circuit of FIG. 1, indicating problematic overshoot in comparison to a target level, in accordance with some embodiments of the present disclosure.

FIG. 2 illustrates typical case 202 and worst-case 204 output 132 of reference circuit 100 of FIG. 1, indicating problematic overshoot in comparison to a target level 206. From a startup point 208 at 10 μs (in this example of graphed data, and refer to the enable 128 in FIG. 1), the output of the voltage reference circuit of FIG. 1 rises rapidly and overshoots the target level 206 of 1.2 V, then undershoots the target level 206, eventually settling to the target level 206.

Figure 3:
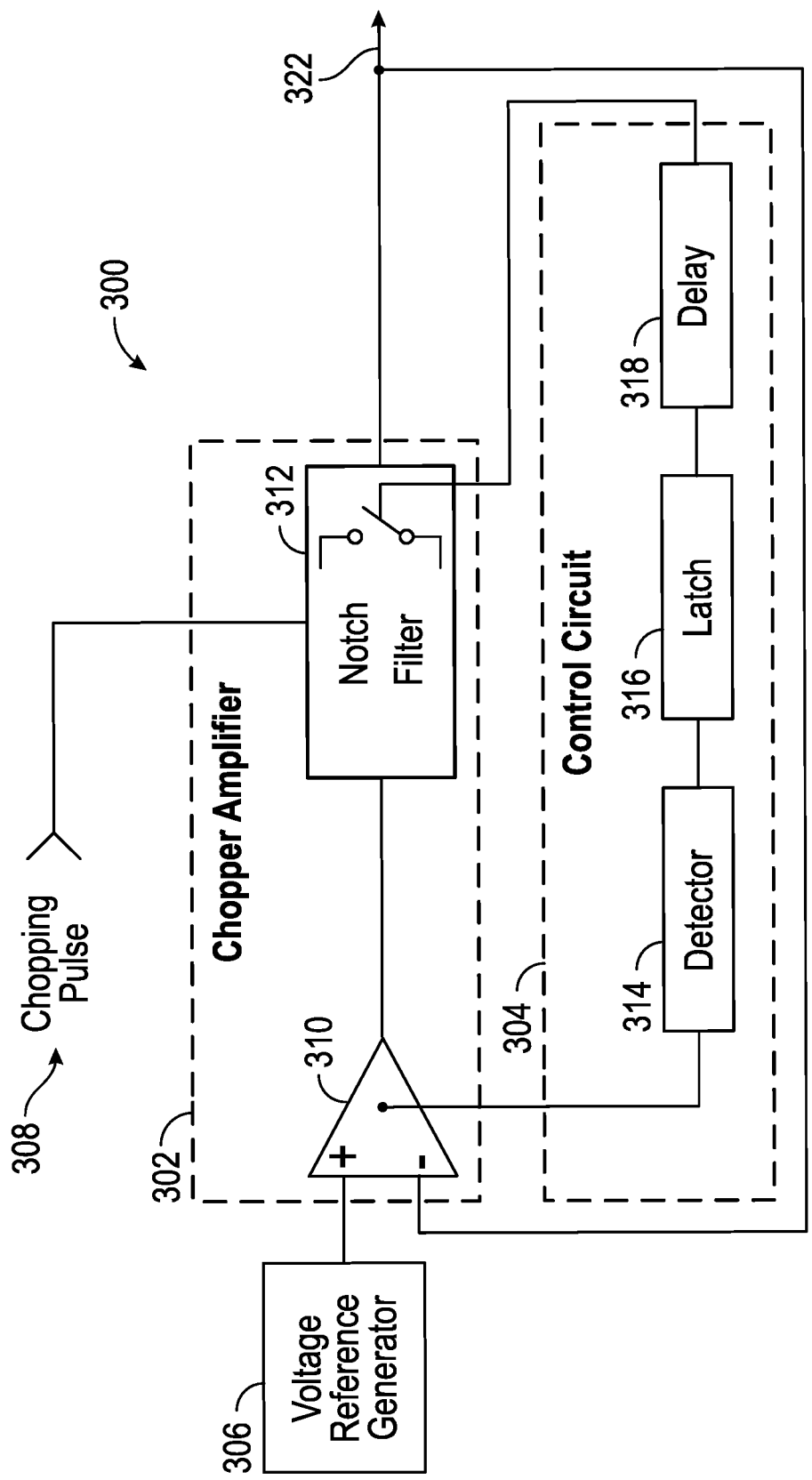
FIG. 3 depicts a high precision voltage reference circuit that includes a voltage reference generator and a chopper amplifier with a control circuit, in accordance with some embodiments of the present disclosure.

FIG. 3 depicts a high precision voltage reference circuit 300 (hereinafter referred to as voltage reference circuit 300) that includes a voltage reference generator 306 and a chopper amplifier 302 with a control circuit 304, in accordance with an embodiment of the present disclosure. The chopper amplifier 302 has an operational amplifier 310 series-connected to a notch filter 312 that is operated by a chopping pulse 308. The output 322 of the notch filter 312 (which may also correspond to the output of the chopper amplifier 302 and the output of the voltage reference circuit 300) is in this embodiment connected as a feedback signal (or more precisely as negative feedback) in a feedback loop to the inverting (−) input of the chopper amplifier 302, and more specifically to the inverting input of the operational amplifier 310. The voltage reference generator 306 is connected to the noninverting (+) input of the chopper amplifier 302, and more specifically to the noninverting input of the operational amplifier 310. The output 322 of the voltage reference circuit 300 of FIG. 3 may provide a buffered, unity gain signal closely matching the reference voltage generated by the voltage reference generator 306 at the input of the voltage reference circuit 300.

The notch filter 312 may comprise a switch 320, and a separate control circuit 304 that operates the switch 320, in order to control operation of the notch filter 312. As shown in FIG. 3, the control circuit 304 comprises a detector 314 that is connected to the operational amplifier 310 of the chopper amplifier 302, a latch 316 for the output of the detector 314, and a delay circuit 318 for the output of the latch 316. The control circuit 304 holds the switch 320 closed in the notch filter 312, disabling chopping in some or all of the notch filter 312, until a delay time after the detector 314 detects a specific signal state in the operational amplifier 310. After the delay time, the control circuit 304 opens the switch 320, enabling chopping in the notch filter 312. As discussed in further detail herein, the notch filter 312 and the control circuit 304 may provide reduced overshoot and undershoot of the output 122 of the voltage reference circuit 100, as well as reduced stabilization time for the output 122 of the voltage reference circuit 100.

Figure 4:
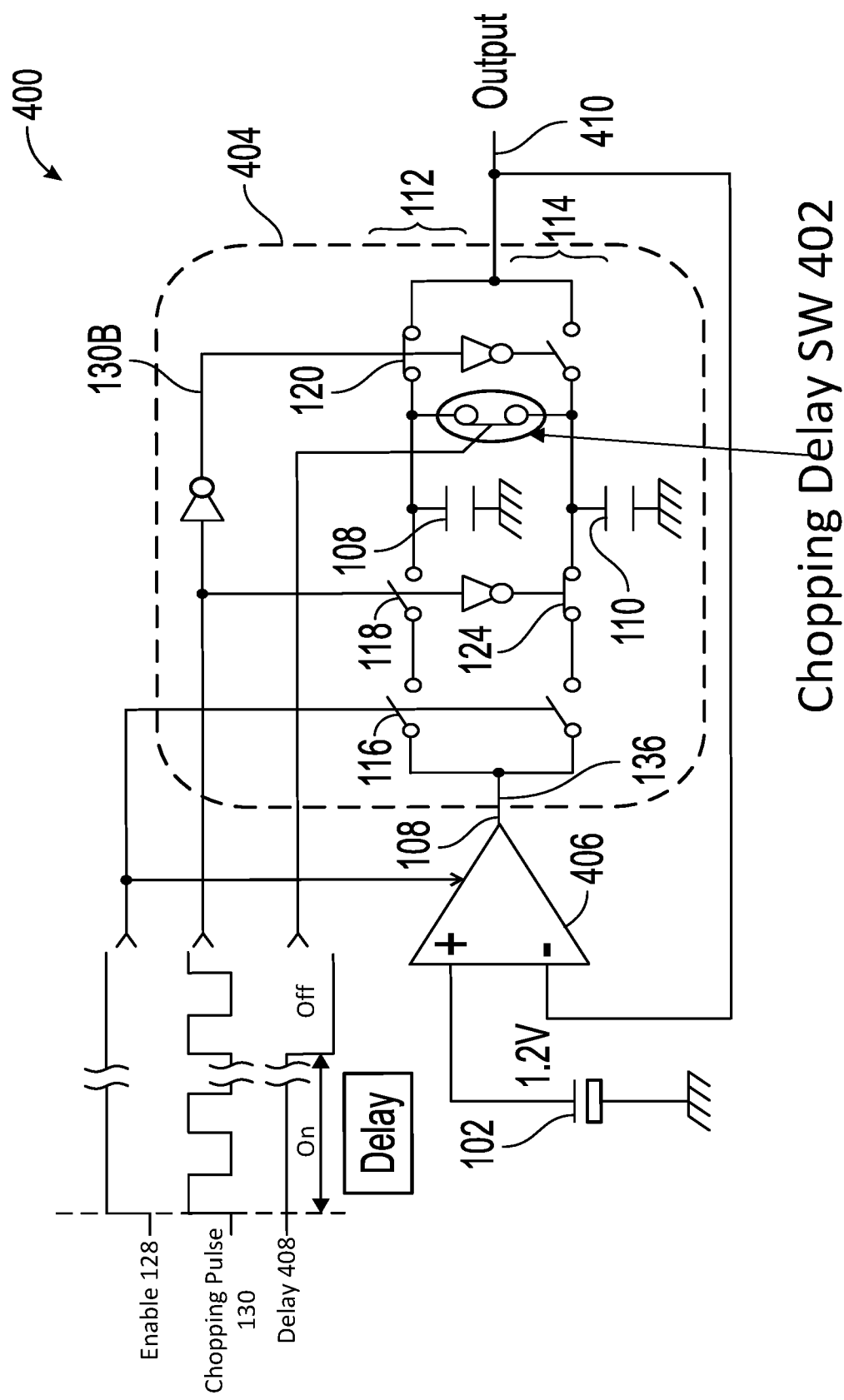
FIG. 4 depicts a voltage reference circuit that has a chopping pulse-operated notch filter with an added chopping delay switch, in accordance with some embodiments of the present disclosure.

FIG. 4 depicts a voltage reference circuit 400 that may be similar to the reference circuit 100 of FIG. 1 in some respects, but includes a chopping pulse-operated notch filter 404 having an added chopping delay switch 402 in accordance with some embodiments of the present disclosure. The chopping delay switch 402 is operated by a chopping delay 408 signal, which opens and closes the chopping delay switch 402. With the chopping delay switch 402 closed, the first branch 112 and the second branch 114 of the notch filter 404 are short-circuited to each other, which disables chopping in that portion of the notch filter 404. This may also be considered disabling chopping in the notch filter 404, generally speaking. With the chopping delay switch 402 opened, the first branch 112 and the second branch 114 of the notch filter 404 are no longer short-circuited to each other, i.e., the short-circuit of the first branch 112 and the second branch 114 of the notch filter 404 to each other is removed, which enables chopping in the notch filter 404. Timing considerations for the chopping delay 408 signal are described below with reference to FIG. 5.

Figure 5:
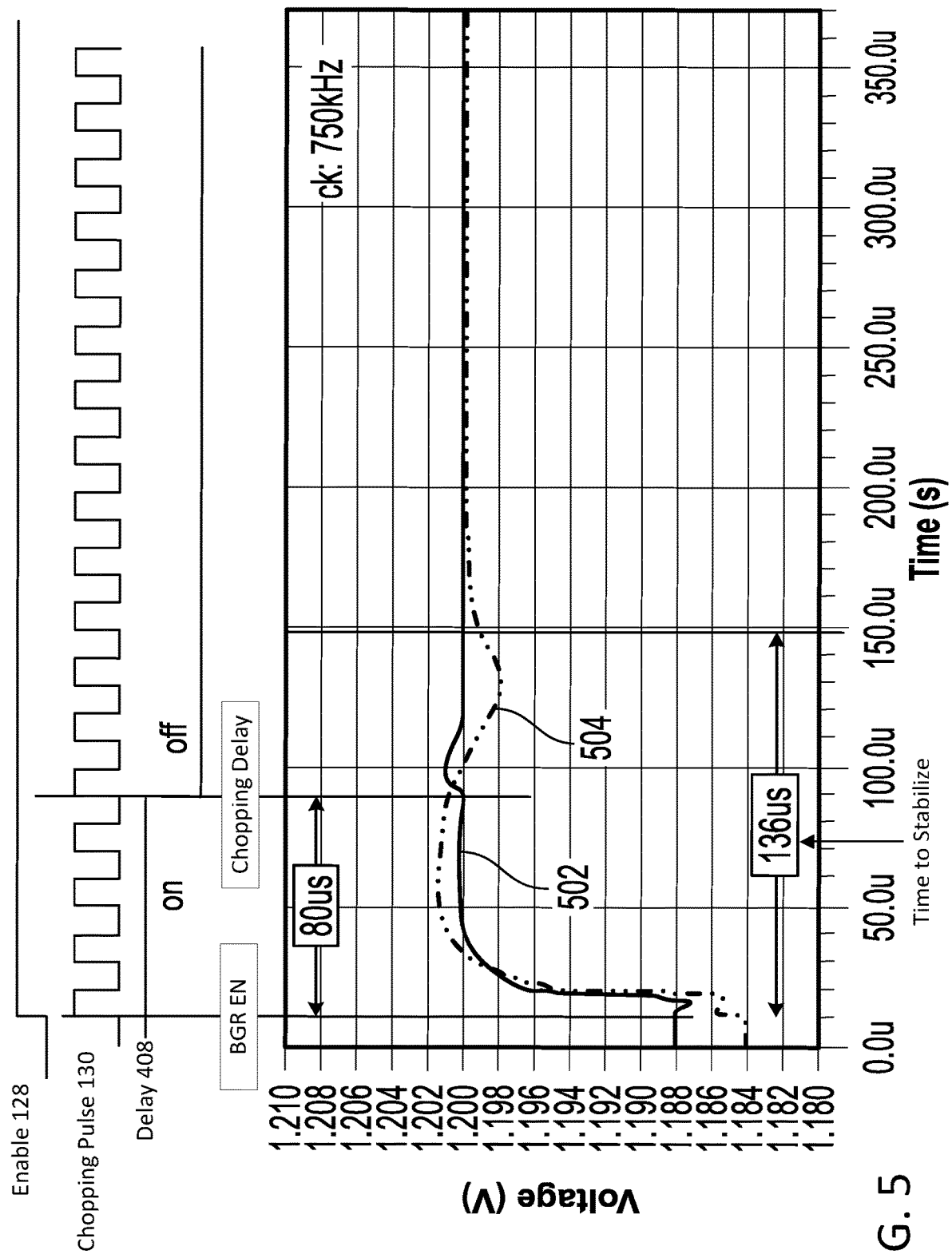
FIG. 5 illustrates typical-case and worst-case scenarios for the output of the voltage reference circuit of FIG. 4, in accordance with some embodiments of the present disclosure.

FIG. 5 illustrates typical 502 and worst-case 504 scenarios for the output 410 of the voltage reference circuit 400 of FIG. 4, in one embodiment. Both signals exhibit decreased overshoot and undershoot in comparison to the typical case 202 and worst-case 204 output 132 of the reference circuit 100 of FIG. 1, illustrated in FIG. 2. In this example data for FIGS. 4 and 5, a chopping delay 408 of 80 μs is applied, resulting in a 136 μs time to stabilize the output 410 of the voltage reference circuit of FIG. 4. Further embodiments are described below.

Figure 6:
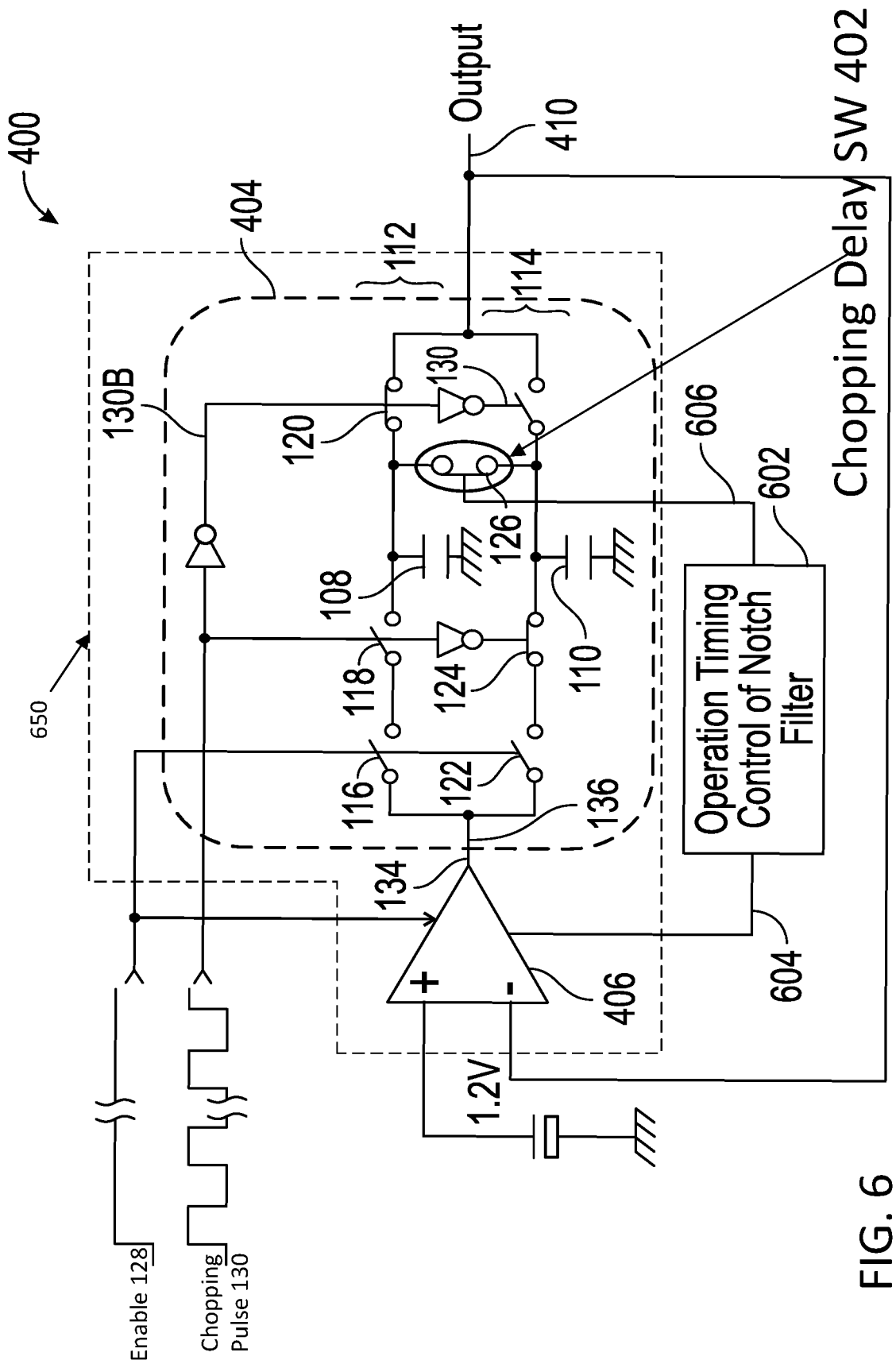
FIG. 6 depicts a voltage reference circuit that includes a control circuit connected to the operational amplifier and the chopping delay switch, in accordance with some embodiments of the present disclosure.

FIG. 6 depicts a voltage reference circuit 600 which may be similar to the reference circuit 400 in some respects but further includes a control circuit 602 connected to the operational amplifier 406 and the chopping delay switch 402 in accordance with some embodiments of the present disclosure. The output 606 of the control circuit 602 controls the chopping delay switch 402, closing and opening the chopping delay switch 402 to perform operation timing control of the notch filter 404. The control circuit 602 may detect that the feedback operation of the chopper amplifier 650 has been established, more specifically that the feedback signal from the output of the notch filter 404 is established in the chopper amplifier 650, and still more specifically that the feedback signal is established in the operational amplifier 406, as further described below. Prior to detecting that the feedback operation of the chopper amplifier 650 has been established, the control circuit 602 maintains the chopping delay switch 402 in a closed state, disabling chopping in the notch filter 404. After detecting that the feedback operation of the chopper amplifier 650 has been established, the control circuit 602 opens the chopping delay switch 402, i.e., changes the chopping delay switch 402 to an open state, and maintains the chopping delay switch 402 in the open state, enabling chopping in the notch filter 404.

Figure 7:
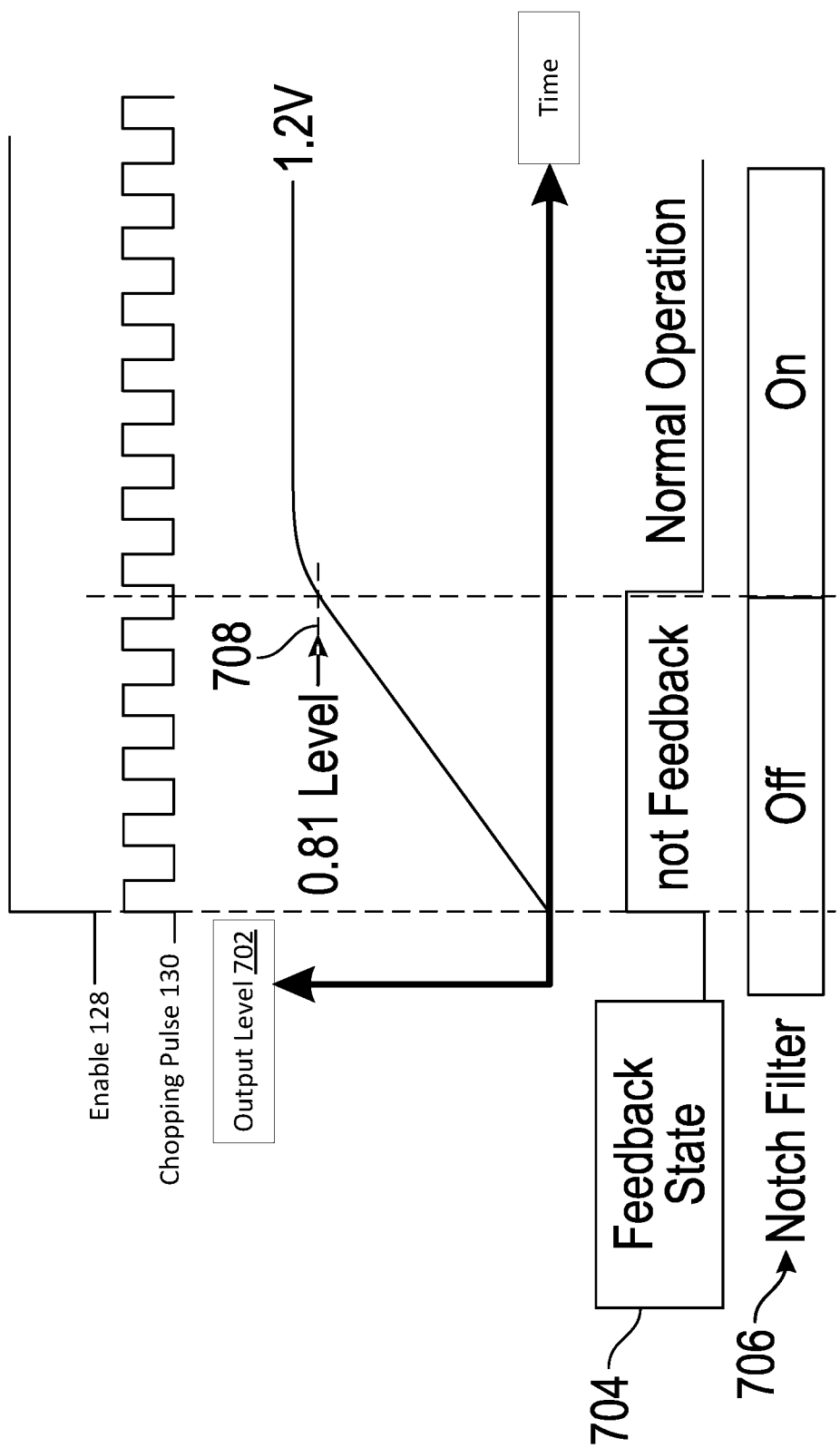
FIG. 7 depicts detection of a voltage level for determination of feedback state, in accordance with some embodiments of the present disclosure.

FIG. 7 depicts detection of a voltage level 708 for determination of feedback state 704 in accordance with an embodiment. The graph depicts the output level 702, measured at the output 410 of the circuit of FIG. 6, rising from 0 V prior to the start of the enable 128 signal, through the specified, detected voltage level 708, to a steady value of 1.2 V over time. Prior to the output level 702 of the output 410 of the circuit reaching the specified voltage level 708, the feedback state 704 is in a "not feedback" condition, and the notch filter state 706 is held in an "off" condition. After the output level 702 of the output 410 of the circuit reaching the specified voltage level 708, the feedback state 704 is in a "normal operation" condition, and the notch filter state 706 is held in an "on" condition. In one embodiment, it is the function of the control circuit 602 (see FIG. 6) to detect the feedback state in the chopper amplifier 650 circuit, more specifically in the operational amplifier 406, and operate the chopping delay switch 402 to control the notch filter state 706 of the notch filter 404, accordingly.

In the embodiment shown in FIG. 7 (see also FIG. 9A), the control circuit 602 (see FIG. 6) is to detect a specified voltage level 708, denoted "0.81 Level", which refers to tuning of the control circuit 602 as further described below. It should be appreciated that further voltage levels and variations in tuning can be used in further embodiments of the present disclosure.

Figure 8:
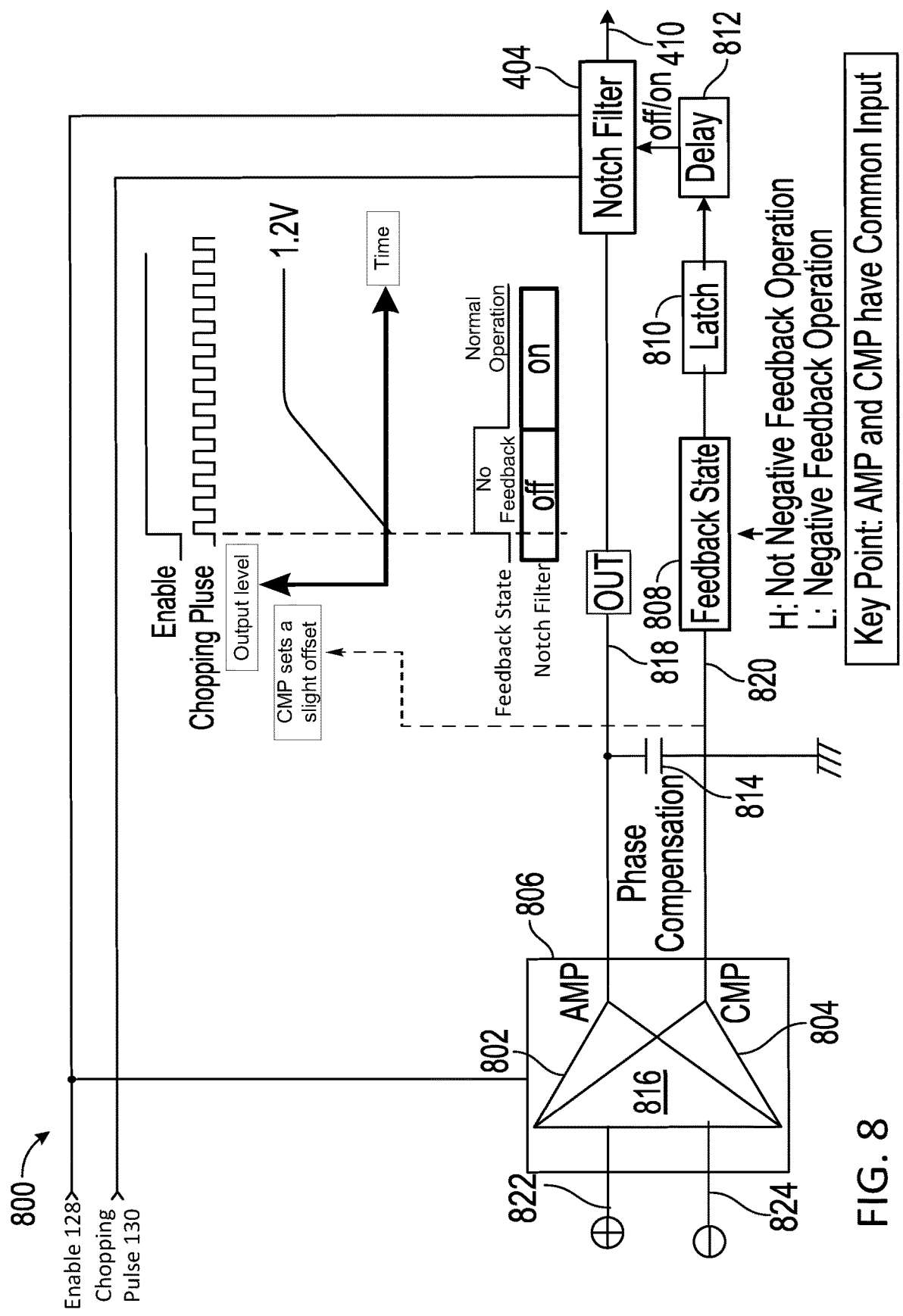
FIG. 8 illustrates a chopper amplifier circuit that may be similar to the chopper amplifier of FIG. 6 in some respects, but may include an operational amplifier circuit that has integrated amplifier and comparator components, in accordance with some embodiments of the present disclosure.

FIG. 8 illustrates a chopper amplifier circuit 800 that may be similar to the chopper amplifier 650 of FIG. 6 in some respects, but may include an operational amplifier circuit 806 that has integrated amplifier 802 and comparator 804 components with a common input section 816 and separate outputs 818, 820, in accordance with an embodiment of the present disclosure having an improved chopper amplifier with controlled operation of a chopping pulse-operated notch filter. The common input section 816 has the noninverting input 822 and inverting input 824 of the operational amplifier circuit 806 as common inputs for both the amplifier 802 and the comparator 804. The amplifier 802 component has an amplifier output 818, and the comparator 804 component has a comparator output 820, as the separate outputs 818, 820 of the operational amplifier circuit 806. In the embodiment shown, a phase compensation capacitor 814 is connected to the amplifier output 818, to compensate phase on that output 818. Integrating the amplifier 802 and comparator 804 components into the operational amplifier circuit 806 implements the functionalities of both components in a combined circuit that results in an offset difference that is smaller than would be the case if the components were separate, and thus an improvement in comparison.

The output 818 of the amplifier circuit 806, with phase compensation 814, is connected as an input to the notch filter 404. The output 820 of the comparator 804 is connected as an input to a feedback state detector 808, which is connected to a latch 810, with output of the latch 810 connected to a delay circuit 812. Output of the delay circuit 812 is connected as a control input to the notch filter 404, turning the notch filter off and on (e.g., disabling and enabling chopping, in embodiments). The feedback state detector 808, the latch 810 and the delay circuit 812 form one embodiment of the control circuit 602 (see FIG. 6).

Figure 9A:
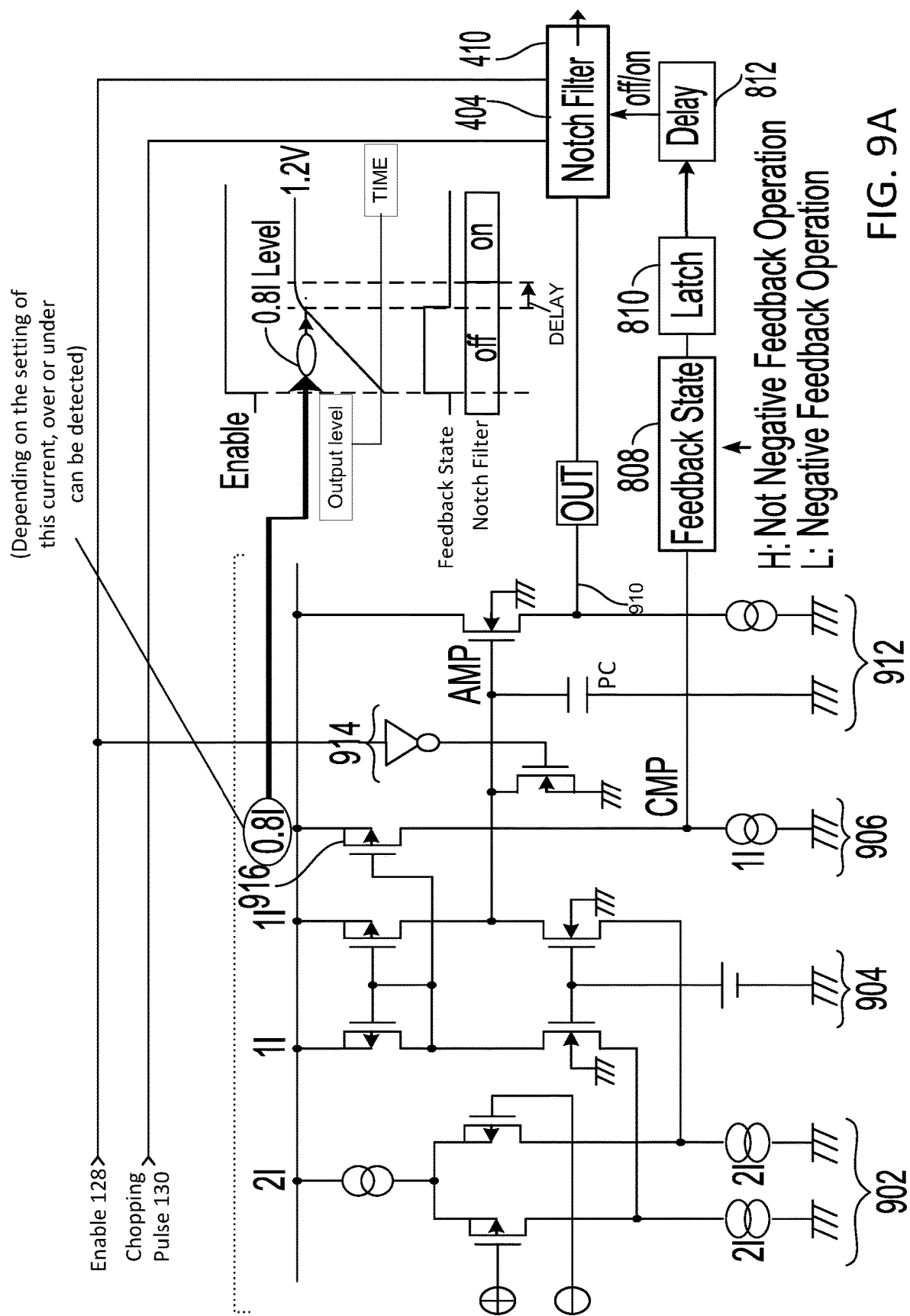
FIG. 9A depicts transistor circuitry of a chopper amplifier, in accordance with some embodiments of the present disclosure.

FIG. 9A depicts transistor circuitry of the chopper amplifier 800 in accordance with some embodiments of the present disclosure. The circuitry satisfies the goal of detecting feedback status, and provides such an input to the feedback state detector 808, which is connected in series to the latch 810 and the delay circuit 812, to control the notch filter 404 according to the feedback status. The circuitry also satisfies an implementation goal of one embodiment the operational amplifier circuit 806 that has integrated amplifier 802 and comparator 804 components with a common input section 816 and separate outputs 818, 820 (see FIG. 8).

The transistor circuitry in FIG. 9A implements a chopper amplifier circuit in CMOS, with PMOS FETs and NMOS FETs that has a differential input amplifier stage 902 with noninverting and inverting inputs, connected to an intermediate differential amplifier stage 904. From the intermediate differential amplifier stage 904, the circuitry branches to a single input amplifier output stage 912 that includes a phase compensation capacitor (shown as "PC" in FIG. 9A) to provide output phase compensation and an amplifier output 910 connecting as input to the notch filter 404, and a comparator stage 906, which has a comparator output 908 connecting as input to the feedback state detector 808. The comparator stage 906 is implemented with a PMOS FET 916 and a current sink, one or both of which are tuned for gain and/or comparator level of the circuit. The gate of the PMOS FET 916, which controls the comparator stage 906, is connected to a node in the intermediate differential amplifier stage 904, or more generally to a node internal to the operational amplifier. Further embodiments of a comparator stage 906 and various amplifier stages may be developed for further embodiments of chopper amplifiers.

For tuning the comparator stage 906, for example to detect the specified voltage level 708 (see FIG. 7) and thereby detect establishment of the feedback operation or feedback state, or more specifically the establishment of the feedback signal from the notch filter 404 in the operational amplifier, the setting of the current for the PMOS FET 916 is in this embodiment 0.8 I, for a current sink of 1 I. Depending on the setting of this current, a higher or lower specified voltage could be detected, i.e., "over or under" can be detected. For example, the channel length and/or channel width of the PMOS FET 916 could be adjusted in various embodiments, to tune the circuit.

Figure 9B:
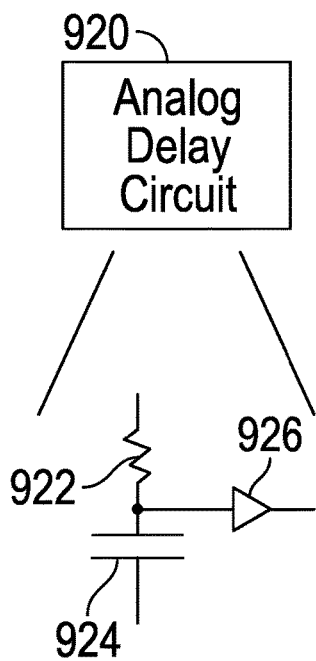
FIG. 9B depicts an analog delay circuit suitable for a chopper amplifier control circuit, in accordance with some embodiments of the present disclosure.

FIG. 9B depicts an analog delay circuit 920 which may be an example of the delay circuit 812 suitable for embodiments of the chopper amplifier control circuit (e.g., control circuit 602 of FIG. 6). Internally, the analog delay circuit 920 has a resistor 922 and capacitor 924 connected as a resistor-capacitor (RC) time delay component, followed by a buffer 926. Variations of analog delay circuits are readily developed in keeping with the teachings herein. For example, multiple stages of RC delays, Schmitt triggers with hysteresis, inverting or noninverting amplifiers, etc. could be used in an analog delay circuit.

Figure 9C:
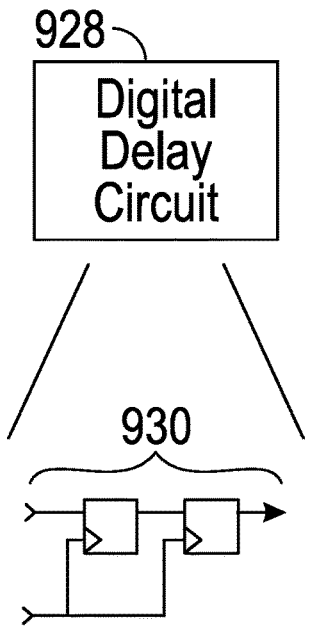
FIG. 9C depicts a digital delay circuit suitable for a chopper amplifier control circuit, in accordance with some embodiments of the present disclosure.

FIG. 9C depicts a digital delay circuit 928 which may be an example of the delay circuit 812 suitable for embodiments of the chopper amplifier control circuit (e.g., control circuit 602 of FIG. 6). Internally, the digital delay circuit 928 has a two-stage shift register, for example two D type flip-flops in series clocked by the chopping pulse. Variations of digital delay circuits are readily developed in keeping with the teachings herein. For example, other types of flip-flops, more or fewer stages, other clocks, and various types of transistors and transistor circuits could be used in a digital delay circuit.

Figure 9D:
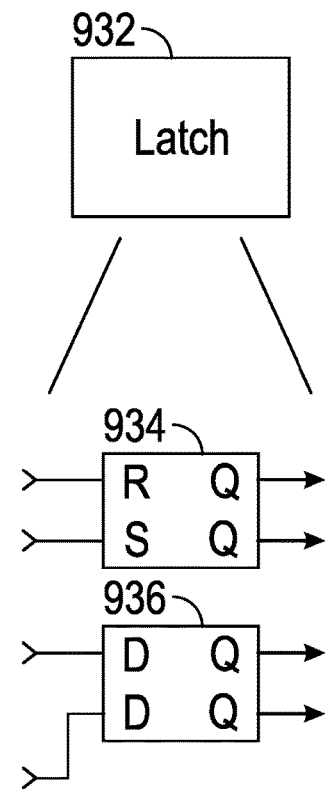
FIG. 9D depicts latches suitable for a chopper amplifier control circuit, in accordance with some embodiments of the present disclosure.

FIG. 9D depicts latches 934 and 936 which may be examples of the latch circuit 810 suitable for embodiments of the chopper amplifier control circuit (e.g., control circuit 602 of FIG. 6). In some embodiments, the latch circuit 810 could be an RS latch 934 with reset and set inputs and Q or Q bar output(s). In other embodiments, the latch circuit 810 could be a D type flip-flop 936 for example, operated by the chopping pulse or another clock. In some embodiments, the latch circuit 810 could be integrated with the delay circuit 812, for example as an input stage to an analog, digital or mixed analog/digital delay circuit. Variations of latches and latch circuits are readily developed in keeping with the teachings herein.

Figure 10A:
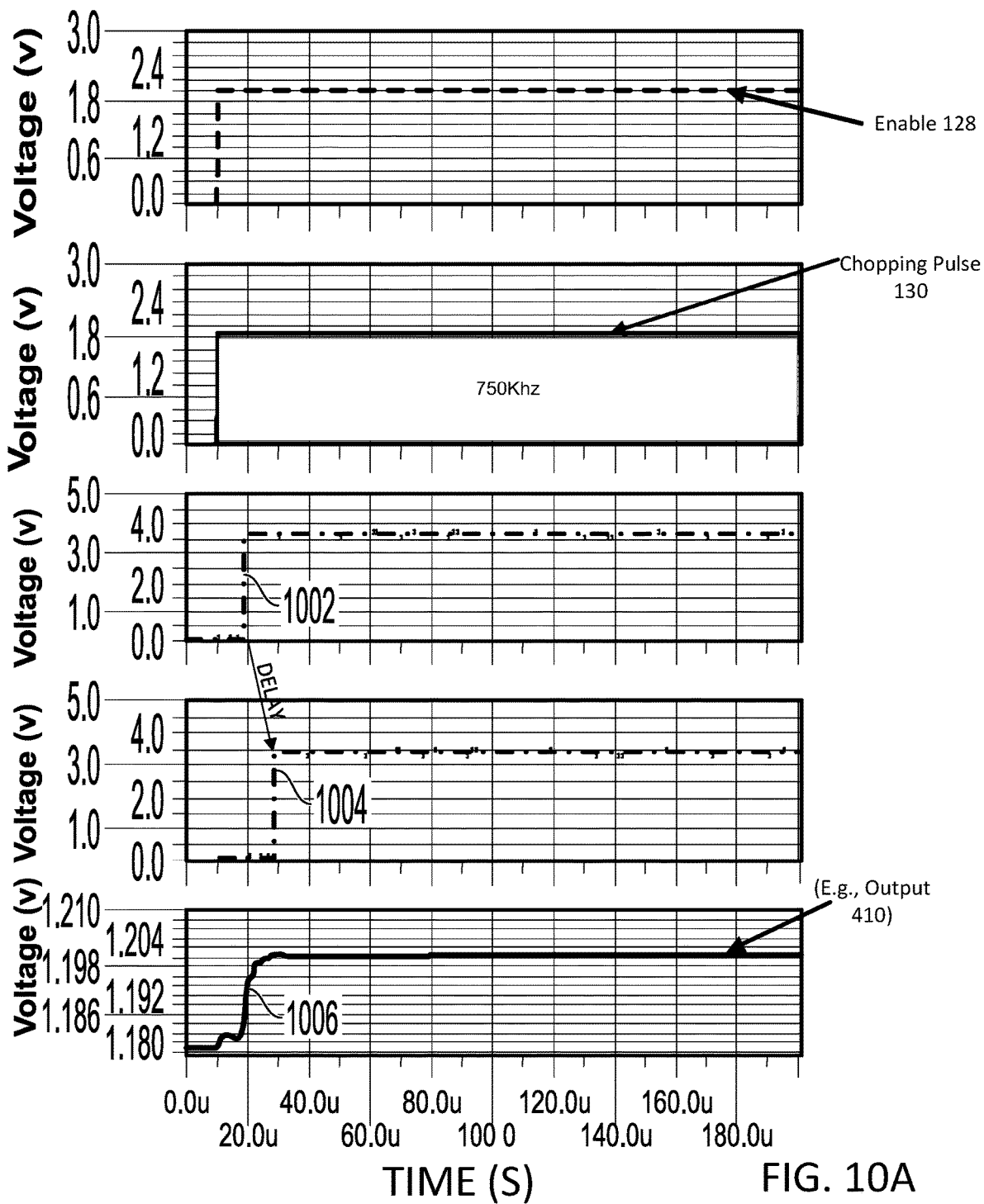
FIG. 10A illustrates waveforms for an embodiment of an improved high precision voltage reference circuit, in accordance with some embodiments of the present disclosure.
Figure 10B:
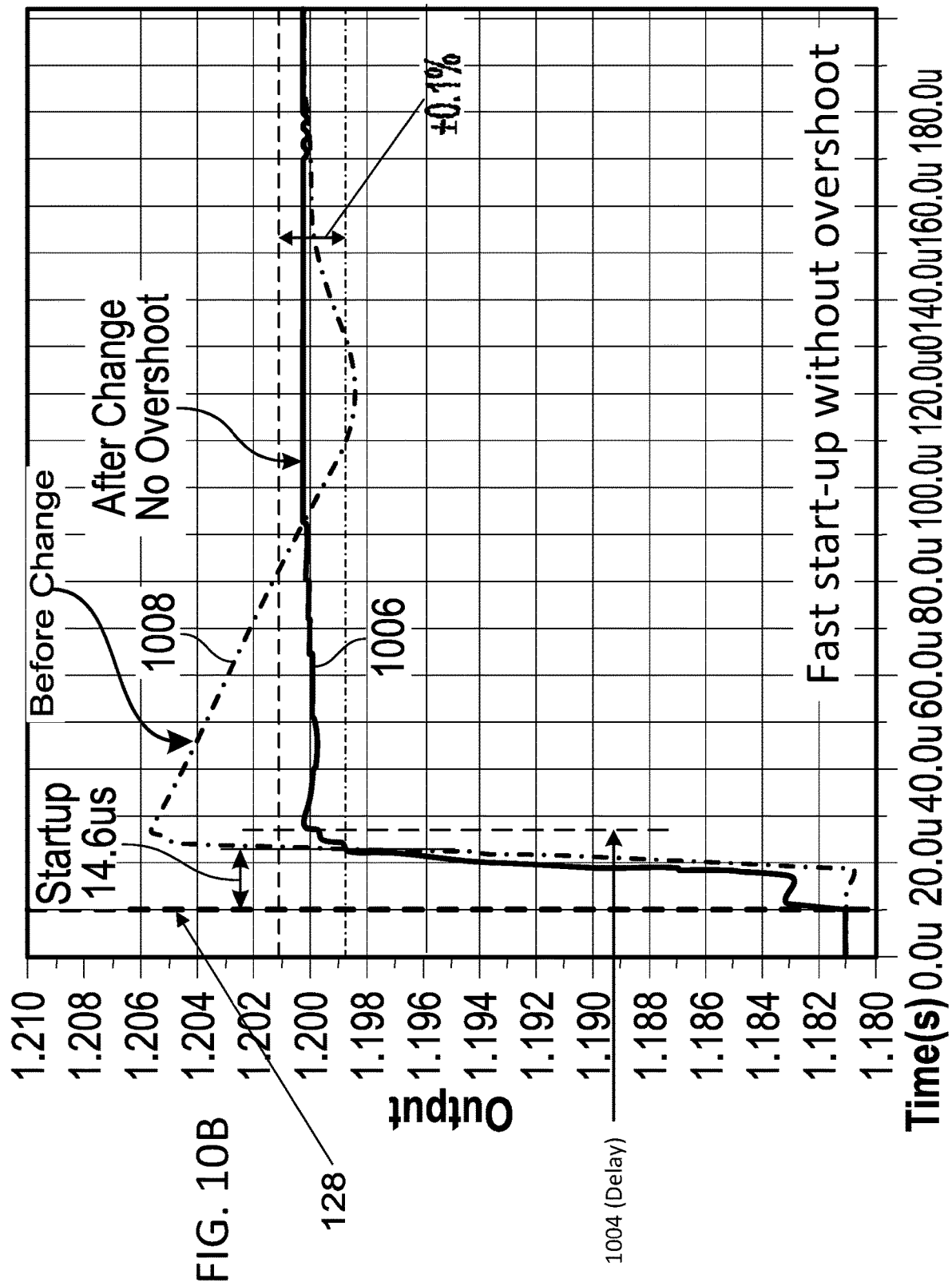
FIG. 10B presents an enlarged and superimposed view of the waveforms of FIG. 10A, in accordance with some embodiments of the present disclosure.

FIG. 10A illustrates waveforms for an embodiment of an improved high precision voltage reference circuit (e.g., voltage reference circuit 400). FIG. 10B presents an enlarged and superimposed view of the waveforms of FIG. 10A. The chopping pulse 130 starts with the rise of the enable 128 signal at 10 μs. Feedback state detection 1002 signal occurs at about 20 μs, followed by the delay 1004 signal (to delay opening the chopping delay switch) at about 28 μs. Output signal 1006, measured at the output 410 of an embodiment of the improved circuit exhibits little or no overshoot after the above-described circuit changes, in comparison to the output signal 1008 corresponding to the output without implementation of embodiments of the present disclosure. As a specific criterion for measuring "without overshoot," the output 1006 signal is observed to stay within plus or minus 0.1% of a target value for one embodiment. FIG. 10B shows that with the various embodiments of improved high precision voltage reference circuits and chopper amplifier circuits, a fast start up without overshoot is possible.

Figure 11:
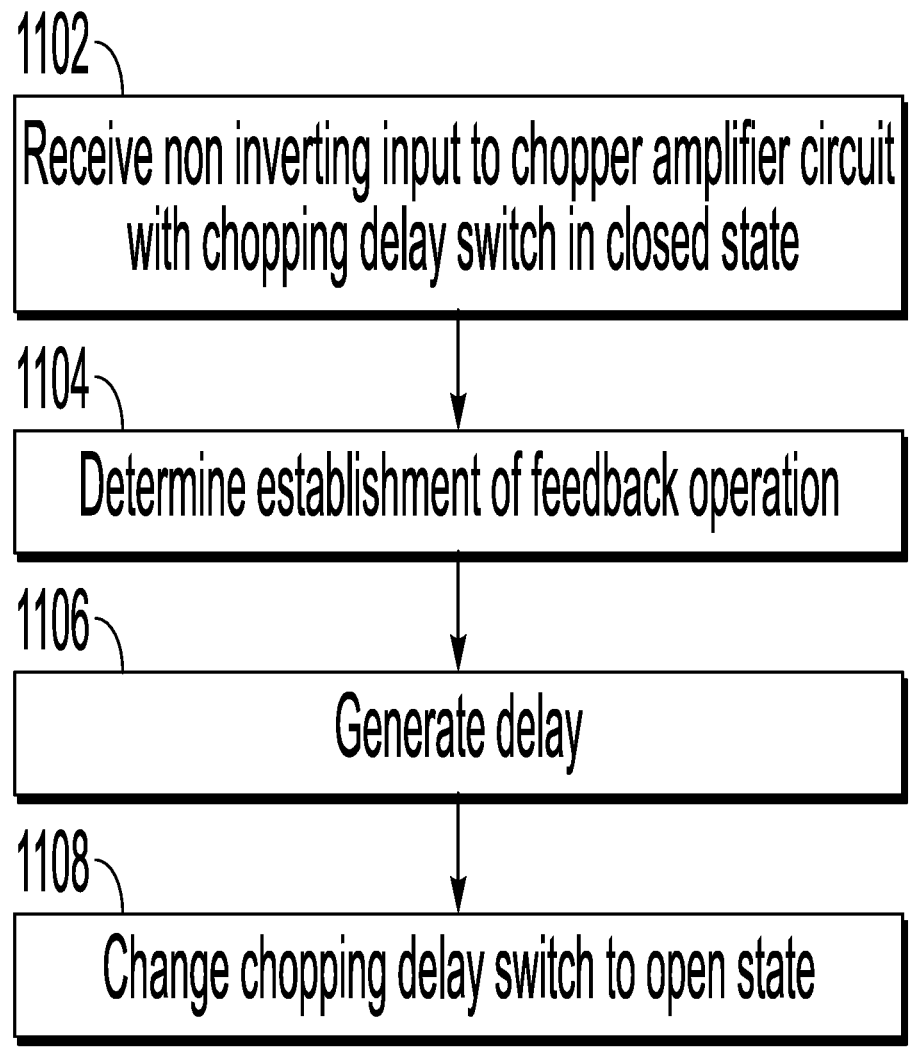
FIG. 11 is a flow diagram of a method of operation of a chopper amplifier circuit, which can be practiced with or by embodiments described herein and variations thereof.

FIG. 11 is a flow diagram of a method of operation of a chopper amplifier circuit, which can be practiced with or by embodiments described herein and variations thereof. More specifically, the method is practiced by circuitry, without use of a processor or processing device. Various embodiments include analog circuitry, and/or mixed analog/digital circuitry.

In an action 1102, a noninverting input is received to the chopper amplifier circuit. In some embodiments, the noninverting input receives a voltage from a voltage reference generator, which can be or include a bandgap circuit. The noninverting input is received with a chopping delay switch in a closed state. In one embodiment, the chopper amplifier circuit has an operational amplifier and a notch filter that is in series connection with the operational amplifier. The output of the notch filter is connected as a feedback signal to the inverting input of the operational amplifier. The chopping delay switch is in the closed state to short-circuit a first branch of the notch filter that has a first capacitor, and a second branch of the notch filter that has a second capacitor, to each other. With the chopping delay switch closed, chopping is disabled in the notch filter.

In an action 1104, the circuit determines establishment of feedback operation at the chopper amplifier circuit, more specifically establishment of the feedback signal at the operational amplifier, in one embodiment according to a control circuit connected to the operational amplifier. In one embodiment, the control circuit detects a voltage level in the operational amplifier, to determine the establishment of feedback operation or establishment of the feedback signal at the operational amplifier. It should be appreciated that further embodiments could detect establishment of the feedback signal, or establishment of feedback operation, in further ways and in further locations in the chopper amplifier circuit.

In an action 1106, the circuit generates a delay. The delay is a delay to opening the chopping delay switch. The delay is based on determining the establishment of feedback operation, for example determining the establishment of the feedback signal at the chopper amplifier through the control circuit detecting the voltage level in the operational amplifier and triggering a delay generation. In one embodiment, the above-described detection is latched, and the latched value triggers the delay generation.

In an action 1108, the circuit changes the chopping delay switch to an open state based on the delay. For example, the control circuit has a delay circuit that is triggered by the above-described detection, and controls the chopping delay switch. Opening the chopping delay switch enables chopping in the notch filter.

Figure 12:
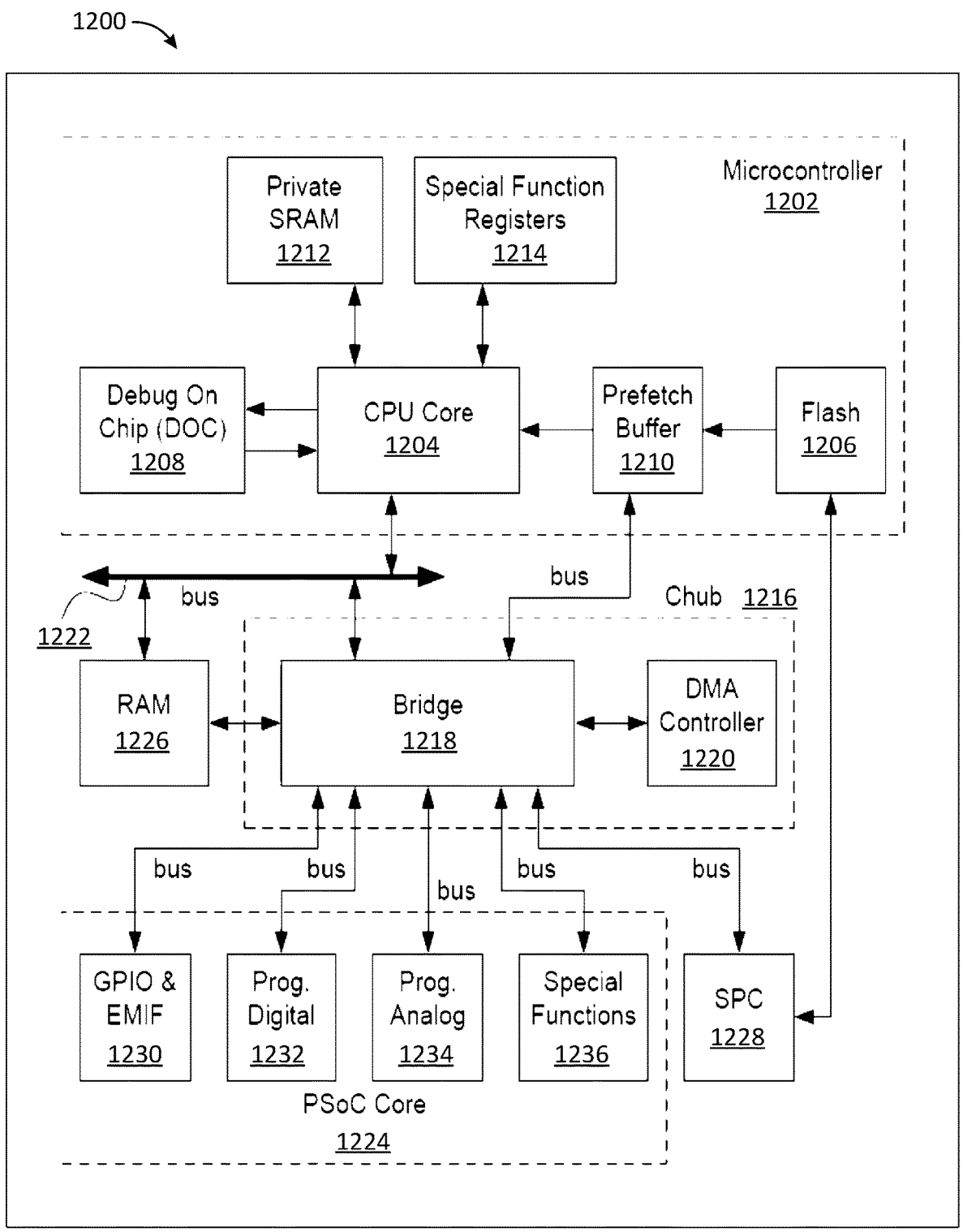
FIG. 12 illustrates an embodiment of a core architecture of a processing device, in which some embodiments of the present disclosure may be implemented.

FIG. 12 illustrates an embodiment of a core architecture 1200 of the PSoC® processing device, such as that used in the PSoC3® family of products offered by Cypress Semiconductor Corporation (San Jose, California). In one embodiment, the core architecture 1200 includes a microcontroller 1202. The microcontroller 1202 includes a CPU (central processing unit) core 1204, flash program storage 1206, DOC (debug on chip) 1208, a prefetch buffer 1210, a private SRAM (static random access memory) 1212, and special functions registers 1214. In an embodiment, the DOC 12108, prefetch buffer 1210, private SRAM 1212, and special function registers 1214 are coupled to the CPU core 1204, while the flash program storage 1206 is coupled to the prefetch buffer 1210.

The core architecture 1200 may also include a CHub (core hub) 1216, including a bridge 1218 and a DMA controller 1220 that is coupled to the microcontroller 1202 via bus 1222. The CHub 1216 may provide the primary data and control interface between the microcontroller 1202 and its peripherals (e.g., peripherals) and memory, and a programmable core 1224. The DMA controller 1220 may be programmed to transfer data between system elements without burdening the CPU core 1204. In various embodiments, each of these subcomponents of the microcontroller 1202 and CHub 1216 may be different with each choice or type of CPU core 1204. The CHub 1216 may also be coupled to shared SRAM 1226 and an SPC (system performance controller) 1228. The private SRAM 1212 is independent of the shared SRAM 1226 that is accessed by the microcontroller 1202 through the bridge 1218. The CPU core 1204 accesses the private SRAM 1212 without going through the bridge 1218, thus allowing local register and RAM accesses to occur simultaneously with DMA access to shared SRAM 1226. Although labeled here as SRAM, these memory modules may be any suitable type of a wide variety of (volatile or non-volatile) memory or data storage modules in various other embodiments. The core architecture 1200 may also include an analog front end 1238 that performs the measurement and digitizing of capacitance values.

In various embodiments, the programmable core 1224 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 1224 includes a GPIO (general purpose IO) and EMIF (extended memory interface) block 1230 to provide a mechanism to extend the external off-chip access of the microcontroller 1202, a programmable digital block 1232, a programmable analog block 1234, and a special functions block 1236, each configured to implement one or more of the subcomponent functions. In various embodiments, the special functions block 1236 may include dedicated (non-programmable) functional blocks and/or include one or more interfaces to dedicated functional blocks, such as USB, a crystal oscillator drive, JTAG, and the like.

The programmable digital block 1232 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 1132 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 1104) intervention and to help prevent the force clock stretching on any bit in the data stream; an I2C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a LINbus interface; a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 1234 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 1234 may support various analog functions including, but not limited to, analog routing, LCD drive IO support, capacitance-sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

FIG. 12 provides an example programmable system on a chip (PSoC) that may use an embodiment of a chopper amplifier or voltage reference circuit as described herein, or variations thereof, in various embodiments. For example, an embodiment of a voltage reference circuit described herein could be used as a voltage reference or other analog resource in the programmable analog block 1134, or used as a voltage reference in an analog-to-digital converter. An embodiment of a chopper amplifier described herein could be used as an analog resource in the programmable analog block 1134.

Embodiments of chopper amplifiers or voltage reference circuits described herein, and variations thereof, may also have applicability in ATV (all-terrain vehicle), microcontroller, automotive, and other technologies. More broadly, such embodiments and variations may have applicability in analog technology.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An apparatus, comprising:
a chopper amplifier comprising an operational amplifier and a notch filter, the notch filter to be operated by a chopping pulse and configured to:
receive as input, an output of the operational amplifier; and
produce a chopper amplifier output that is provided as a feedback signal to an inverting input of the operational amplifier;
a chopping delay switch connected to a first branch of the notch filter having a first capacitor, and connected to a second branch of the notch filter having a second capacitor; and
a control circuit configured to:
close the chopping delay switch to short-circuit the first branch and the second branch of the notch filter to each other;
detect establishment of the feedback signal at the chopper amplifier; and
in response to detecting the establishment of the feedback signal at the chopper amplifier, open the chopping delay switch.

2. The apparatus of claim 1, wherein the control circuit is further configured to generate a delay to opening the chopping delay switch, in response to detecting the establishment of the feedback signal at the chopper amplifier.

3. The apparatus of claim 1, wherein:
to close the chopping delay switch, the control circuit is configured to disable chopping in the notch filter by a short-circuit of the first branch and the second branch of the notch filter to each other; and
to open the chopping delay switch, the control circuit is configured to enable the chopping in the notch filter by removal of the short-circuit of the first branch and the second branch of the notch filter to each other.

4. The apparatus of claim 1, wherein to detect the establishment of the feedback signal at the chopper amplifier, the control circuit is configured to detect a voltage level within the chopper amplifier.

5. The apparatus of claim 1, wherein the control circuit comprises:
a feedback state detector connected to a node of the operational amplifier;
a latch having an input coupled to an output of the feedback state detector; and
a delay circuit having an input coupled to an output of the latch, and having an output coupled to a control terminal of the chopping delay switch to delay opening the chopping delay switch.

6. The apparatus of claim 1, further comprising:
a reference voltage generator connected to a noninverting input of the operational amplifier.

7. The apparatus of claim 6, wherein the reference voltage generator comprises a bandgap circuit connected as a voltage reference to a noninverting input of the operational amplifier, wherein the apparatus comprises a high precision bandgap reference (HPBGR).

8. The apparatus of claim 1, wherein the notch filter comprises:
the input to the notch filter is connected to a first switch of the first branch and a first switch of the second branch, the first switch of each of the first and second branches controlled by an enable signal;
the first switch of the first branch connected to a second switch of the first branch that is controlled by the chopping pulse and connected to the first capacitor;
the first switch of the second branch connected to a second switch of the second branch that is controlled by an inverse of the chopping pulse and connected to the second capacitor;
the second switch of the first branch, and the first capacitor, connected to a first terminal of the chopping delay switch and connected to a third switch of the first branch that is controlled by an inverse of the chopping pulse;
the second switch of the second branch, and the second capacitor, connected to a second terminal of the chopping delay switch and connected to a third switch of the second branch that is controlled by an inverse of one of the inverses of the chopping pulse, wherein to close the chopping delay switch is to short-circuit the first branch and the second branch of the notch filter, at the first capacitor and the second capacitor, to each other, to disable chopping in the notch filter; and the third switch of the first branch and the third switch of the second branch connected to each other and to the output of the notch filter.

9. The apparatus of claim 1, wherein:
the operational amplifier comprises a complementary metal oxide semiconductor (CMOS) field effect transistor (FET) circuit configured to operate based on an enable signal;
the notch filter comprises a further CMOS FET circuit with the first branch comprising the first capacitor and a first plurality of switches configured to receive the enable signal, the chopping pulse and an inverse of the chopping pulse, the second branch comprising the second capacitor and a second plurality of switches configured to receive the enable signal, the inverse of the chopping pulse, and an inverse of the inverse of the chopping pulse; and
the chopping delay switch comprises an FET.

10. A chopper amplifier circuit, comprising:
an operational amplifier circuit having an inverting input, a noninverting input and an output;
a notch filter circuit configured to be operated by a chopping pulse, the notch filter circuit comprising:
an input connected to the output of the operational amplifier circuit;
a first branch having a first plurality of switches and a first capacitor;
a second branch having a second plurality of switches and a second capacitor; and
an output connected as a feedback signal to the inverting input of the operational amplifier circuit;
a chopping delay switch connected to selectively short-circuit a portion of the first branch and a portion of the second branch to each other; and
a control circuit connected to the operational amplifier circuit and the chopping delay switch, the control circuit configured to:
detect establishment of the feedback signal at the operational amplifier circuit;
close the chopping delay switch to short-circuit the portion of the first branch and the portion of the second branch, prior to detecting the establishment of the feedback signal at the operational amplifier circuit; and
open the chopping delay switch, responsive to the detecting the establishment of the feedback signal at the operational amplifier circuit.

11. The chopper amplifier circuit of claim 10, wherein the control circuit comprises:
a voltage detector having an input connected to a node in the operational amplifier circuit, the voltage detector configured to detect a voltage level at the node as the establishment of the feedback signal at the operational amplifier circuit;
a reset set (RS) latch coupled to the voltage detector; and
an analog delay circuit coupled to the RS latch and coupled to the chopping delay switch, the analog delay circuit configured to delay opening the chopping delay switch.

12. The chopper amplifier circuit of claim 10, wherein the control circuit comprises:
a voltage detector integrated in the operational amplifier circuit, the voltage detector configured to detect a voltage level in the operational amplifier circuit as the establishment of the feedback signal at the operational amplifier circuit;

a D type flip-flop, coupled to an output of the voltage detector, the D type flip flop configured to be operated by the chopping pulse; and
a shift register delay circuit, coupled to an output of the D type flip-flop, the shift register delay circuit configured to be operated by the chopping pulse, and having an output coupled to the chopping delay switch to delay opening the chopping delay switch.

13. The chopper amplifier circuit of claim 10, further comprising:
a bandgap circuit configured to generate a voltage reference, the bandgap circuit connected to the noninverting input of the operational amplifier circuit.

14. The chopper amplifier circuit of claim 10, wherein:
the operational amplifier circuit has an enable input and comprises a complementary metal oxide semiconductor (CMOS) field effect transistor (FET) circuit;
the notch filter circuit has a further enable input and comprises a further CMOS FET circuit;
the chopping delay switch comprises an FET; and
the control circuit comprises a voltage detector integrated with the operational amplifier circuit such that the operational amplifier circuit and the voltage detector share a common input section and have separate outputs.

15. The chopper amplifier circuit of claim 10, wherein:
closing the chopping delay switch enables the short-circuit of the portion of the first branch and the portion of the second branch and disable chopping in at least a portion of the notch filter circuit; and
opening the chopping delay switch disables the short-circuit of the portion of the first branch and the portion of the second branch through removal of the short-circuit, and enable chopping in at least the portion of the notch filter circuit.

16. A method comprising:
receiving a noninverting input to a chopper amplifier circuit, the chopper amplifier circuit comprising an operational amplifier and a notch filter that is in series connection with the operational amplifier and has an output of the notch filter connected as a feedback signal to an inverting input of the operational amplifier, wherein a chopping delay switch is in a closed state to short-circuit a first branch of the notch filter having a first capacitor and a second branch of the notch filter having a second capacitor, to each other;
determining establishment of the feedback signal at the operational amplifier, according to a control circuit connected to the operational amplifier;
generating a delay to opening the chopping delay switch, based on the determining the establishment of the feedback signal at the operational amplifier; and
changing the chopping delay switch to an open state, based on the determining the establishment of the feedback signal at the operational amplifier and the delay.

17. The method of operation of the chopper amplifier circuit of claim 16, wherein the determining the establishment of the feedback signal at the operational amplifier comprises:
detecting a voltage level in the operational amplifier.

18. The method of operation of the chopper amplifier circuit of claim 16, further comprising:
providing a voltage reference, from a bandgap circuit, to a noninverting input of the operational amplifier.

19. The method of operation of the chopper amplifier circuit of claim 16, wherein:

the changing the chopping delay switch to the open state comprises enabling chopping in the notch filter by removal of the short-circuit of the first branch and the second branch of the notch filter to each other.

20. The method of operation of the chopper amplifier circuit of claim 16, further comprising:
  latching the determined establishment of the feedback signal at the operational amplifier, wherein the generating the delay to the opening the chopping delay switch is based on the latched determined establishment of the feedback signal at the operational amplifier.

\* \* \* \* \*